US012802774B2

(12) United States Patent
Ka et al.

(10) Patent No.: US 12,802,774 B2
(45) Date of Patent: Nov. 17, 2026

(54) SEMICONDUCTOR DEVICES RELATED TO PRECHARGE OPERATION

(71) Applicant: SK hynix Inc., Icheon-si (KR)

(72) Inventors: Dong Yoon Ka, Icheon-si (KR); Tae Kyun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 131 days.

(21) Appl. No.: 18/442,866

(22) Filed: Feb. 15, 2024

(65) Prior Publication Data

US 2025/0140334 A1 May 1, 2025

(30) Foreign Application Priority Data

Oct. 30, 2023 (KR) ........................ 10-2023-0147194

(51) Int. Cl.
*G11C 29/50* (2006.01)

(52) U.S. Cl.
CPC .................. *G11C 29/50004* (2013.01); *G11C 2029/5004* (2013.01)

(58) Field of Classification Search
CPC ...... G11C 29/50004; G11C 2029/5004; G11C 7/222; G11C 7/1006; G11C 29/022; G11C 29/1201
See application file for complete search history.

(56) References Cited

U.S. PATENT DOCUMENTS

2004/0223354 A1* 11/2004 Lee ...................... G11C 7/1048 365/145
2010/0309738 A1* 12/2010 Na ....................... G11C 29/025 365/201
2021/0035616 A1* 2/2021 Kang ....................... G11C 7/12

FOREIGN PATENT DOCUMENTS

KR 1020090088171 A 8/2009
KR 1020120121309 A 11/2012

* cited by examiner

*Primary Examiner* — Mohammed A Bashar
(74) *Attorney, Agent, or Firm* — WILLIAM PARK AND ASSOCIATES LTD.

(57) ABSTRACT

A semiconductor device includes a precharge pulse generation circuit configured to generate a first precharge pulse and a second precharge pulse, based on a column pulse generated when a column operation including a write operation and a read operation is performed. The semiconductor device also includes an input/output switching signal generation circuit configured to generate an input/output switching signal for connecting a first input/output line pair and a second input/output line pair to each other, based on the first precharge pulse and the second precharge pulse in a test mode.

34 Claims, 10 Drawing Sheets

SEMICONDUCTOR DEVICES RELATED TO PRECHARGE OPERATION

CROSS-REFERENCE TO RELATED APPLICATION

The present application claims priority under 35 U.S.C. 119 (a) to Korean Patent Application No. 10-2023-0147194, filed on Oct. 30, 2023, which is incorporated herein by reference in its entirety.

BACKGROUND

1. Technical Field

Some embodiments of the present disclosure relate to semiconductor devices related to precharge operations.

2. Related Art

Recently, as the operation speed of semiconductor devices has increased, various methods are being developed to speed up data input and output operations. The data input and output operations are determined by the sum of the time when the input and output line is driven and the time when the input and output line is precharged. Accordingly, the data input/output operations can be speeded up by reducing the time during which the input/output line is driven or the time during which the input/output line is precharged.

SUMMARY

In accordance with an embodiment of the present disclosure, a semiconductor device may include a precharge pulse generation circuit configured to generate a first precharge pulse and a second precharge pulse, based on a column pulse generated when a column operation including a write operation and a read operation is performed. The semiconductor device may also include an input/output switching signal generation circuit configured to generate an input/output switching signal for connecting a first input/output line pair and a second input/output line pair to each other, based on the first precharge pulse and the second precharge pulse in a test mode.

In accordance with an embodiment of the present disclosure, a semiconductor device may include a first precharge pulse generation circuit configured to generate a first precharge pulse and a second precharge pulse, based on a first column pulse generated when a first column operation including a write operation and a read operation is performed on a first bank. The semiconductor device may also include a second precharge pulse generation circuit configured to generate a third precharge pulse and a fourth precharge pulse, based on a second column pulse generated when a second column operation including a write operation and a read operation is performed on a second bank. The semiconductor device may further include an input/output switching signal generation circuit configured to generate a first input/output switching signal for connecting a first input/output line pair and a second input/output line pair, based on the second column pulse and the second precharge pulse in a test mode.

DETAILED DESCRIPTION

In the following description of embodiments, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes two bits, when the logic level of each of the two bits included in the signal is "logic low level, logic low level", the logic bit set of the signal may be set as the first logic bit set, and when the logic level of each of the two bits included in the signal is "a logic low level and a logic high level," the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
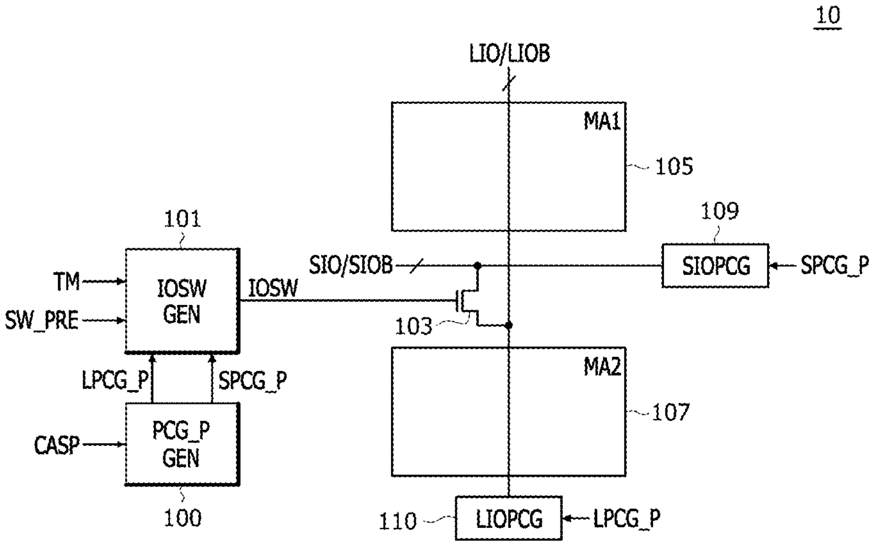
FIG. 1 is a block diagram illustrating a configuration of a semiconductor device according to an embodiment of the present disclosure.

FIG. 1 is a block diagram illustrating a configuration of a semiconductor device 10 according to an embodiment of the present disclosure. As shown in FIG. 1, the semiconductor device 10 may include a precharge pulse generation circuit (PCG_P GEN) 100, an input/output switching signal generation circuit (IOSW GEN) 101, an input/output switch 103, a first memory cell array (MA1) 105, a second memory cell array (MA2) 107, a first input/output line precharge circuit (SIOPCG) 109, and a second input/output line precharge circuit (LIOPCG) 110.

The precharge pulse generation circuit 100 may generate a first precharge pulse SPCG_P and a second precharge pulse LPCG_P, based on a column pulse CASP. The precharge pulse generation circuit 100 may sequentially generate the first precharge pulse SPCG_P and the second precharge pulse LPCG_P when the column pulse CASP is generated. The column pulse CASP may be generated when a command included in a command address CA is decoded and a column operation including a write operation and a read operation is performed for one of the first memory cell array 105 and the second memory cell array 107 in the semiconductor device 10. The command address CA may be received from a controller (e.g., 31 in FIG. 8). The first precharge pulse SPCG_P may be generated after the column pulse CASP is generated, and the second precharge pulse LPCG_P may be generated after the first precharge pulse SPCG_P is generated, but this is only an example, and the present disclosure is not limited thereto. The precharge pulse generation circuit 100 may be electrically connected to the input/output switching signal generation circuit 101, the first input/output line precharge circuit 109, and the second input/output line precharge circuit 110 to apply the first precharge pulse SPCG_P and the second precharge pulse LPCG_P to the input/output switching signal generation circuit 101, may apply the first precharge pulse SPCG_P to the first input/output line precharge circuit 109, and may apply the second precharge pulse LPCG_P to the second input/output line precharge circuit 110.

The input/output switching signal generation circuit 101 may generate an input/output switching signal IOSW from a pre-switching signal SW_PRE, the first precharge pulse SPCG_P, and the second precharge pulse LPCG_P, based on a test mode signal TM. The pre-switching signal SW_PRE may be activated during a preset interval when a write operation is performed on one of the first memory cell array 105 and the second memory cell array 107, and may be deactivated when a read operation is performed on one of the first memory cell array 105 and the second memory cell array 107. The input/output switching signal generation circuit 101 may generate a test column pulse (e.g., TCASP in FIG. 2), based on the first precharge pulse SPCG_P and the second precharge pulse LPCG_P. As an example, the input/output switching signal generation circuit 101 may generate the test column pulse (e.g., TCASP in FIG. 2) from a time point at which generation of the second precharge pulse LPCG_P stops to a time point at which the first precharge pulse SPCG_P is generated. The input/output switching signal generation circuit 101 may generate the input/output switching signal IOSW from the pre-switching signal SW_PRE and the test column pulse (e.g., TCASP in FIG. 2), based on the test mode signal TM. The test mode signal TM may be activated in a test mode. As an example, the input/output switching signal generation circuit 101 may output the test column pulse (e.g., TCASP in FIG. 2) as the input/output switching signal IOSW when the test mode signal TM is activated, and may output the pre-switching signal SW_PRE as the input/output switching signal IOSW when the test mode signal TM is deactivated. The input/output switching signal generation circuit 101 may be electrically connected to the input/output switch 103 to apply the input/output switching signal IOSW to the input/output switch 103.

The input/output switch 103 may be connected between a first input/output line pair SIO/SIOB and a second input/output line pair LIO/LIOB to be turned on (closed) based on the input/output switching signal IOSW. In a test mode, when a read operation is performed and the first precharge pulse SPCG_P and the second precharge pulse LPCG_P are sequentially generated, the input/output switch 103 may be turned on by the input/output switching signal IOSW generated based on the first precharge pulse SPCG_P and the second precharge pulse LPCG_P to connect the first input/output line pair SIO/SIOB and the second input/output line pair LIO/LIOB to each other. When the first input/output line pair SIO/SIOB and the second input/output line pair LIO/LIOB are connected to each other in a precharged state, the first input/output line pair SIO/SIOB and the second input/output line pair LIO/LIOB may share the precharged voltage level with each other. Accordingly, the precharge time of the first input/output line pair SIO/SIOB and the second input/output line pair LIO/LIOB can be reduced.

The first memory cell array 105 and the second memory cell array 107 may form one bank sharing the first input/output line pair SIO/SIOB and the second input/output line pair LIO/LIOB. Here, two memory cell arrays are shown to form one bank, but this is only an example, and the present disclosure is not limited thereto.

The first input/output line precharge circuit 109 may precharge the first input/output line pair SIO/SIOB, based on the first precharge pulse SPCG_P. The second input/output line precharge circuit 110 may precharge the second input/output line pair LIO/LIOB, based on the second precharge pulse LPCG_P.

Figure 2:
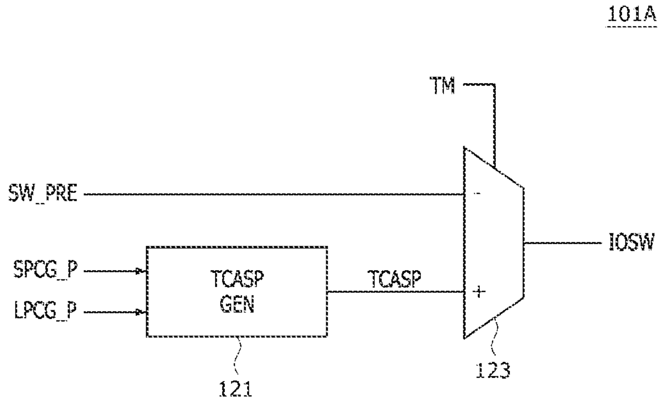
FIG. 2 is a block diagram according to an embodiment of an input/output switching signal generation circuit included in the semiconductor device shown in FIG. 1.

FIG. 2 is a block diagram of an input/output switching signal generation circuit 101A according to an embodiment of the input/output switching signal generation circuit 101 shown in FIG. 1. As shown in FIG. 2, the input/output switching signal generation circuit 101A may include a test column pulse generation circuit (TCASP GEN) 121 and an input/output switching signal selection circuit 123.

The test column pulse generation circuit 121 may generate the test column pulse TCASP, based on the first precharge pulse SPCG_P and the second precharge pulse LPCG_P. As an example, the test column pulse generation circuit 121 may generate the test column pulse TCASP from the time point when generation of the second precharge pulse LPCG_P stops to the time point when the first precharge pulse SPCG_P is generated. The test column pulse generation circuit 121 may be electrically connected to the input/output switching signal selection circuit 123 to apply the test column pulse TCASP to the input/output switching signal selection circuit 123.

The input/output switching signal selection circuit 123 may generate the input/output switching signal IOSW from the pre-switching signal SW_PRE and the test column pulse TCASP, based on the test mode signal TM. The input/output switching signal selection circuit 123 may output the test column pulse TCASP as the input/output switching signal IOSW when the test mode signal TM is activated at a logic “high” level, and may output the pre-switching signal SW_PRE as the input/output switching signal IOSW when the test mode signal TM is deactivated at a logic “low” level.

The input/output switching signal generation circuit 101A configured as described above may generate the input/output switching signal IOSW from the time point at which generation of the second precharge pulse LPCG_P stops to the time point at which the first precharge pulse SPCG_P is generated when a read operation is performed on one of the first memory cell array 105 and the second memory cell array 107 in the test mode.

Figure 3:
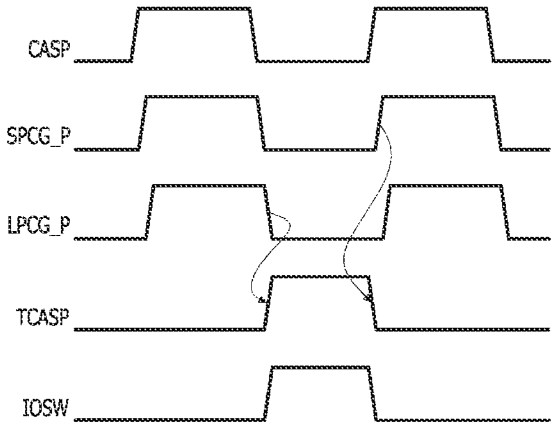
FIG. 3 is a timing diagram illustrating an operation performed for precharging input/output lines during a read operation in a test mode, in the semiconductor device shown in FIGS. 1 and 2.

FIG. 3 is a timing diagram illustrating an operation performed for precharging input/output lines during a read operation in a test mode, in the semiconductor device 10 shown in FIGS. 1 and 2.

As shown in FIGS. 1 and 3, in the test mode, when a read operation is performed on one of the first memory cell array 105 and the second memory cell array 107, the first precharge pulse SPCG_P and the second precharge pulse LPCG_P may be sequentially generated after the column pulse CASP is generated. The test column pulse TCASP may be generated from the time point at which the generation of the second precharge pulse LPCG_P stops to the time point at which the first precharge pulse SPCG_P is generated, and the input/output switch 103 may be turned on by the input/output switching signal IOSW generated by the test column pulse TCASP. Accordingly, the first input/output line pair SIO/SIOB and the second input/output line pair LIO/LIOB may share the precharged voltage level with each other in an interval in which the input/output switching signal IOSW is generated, thereby reducing the precharge time.

Figure 4:
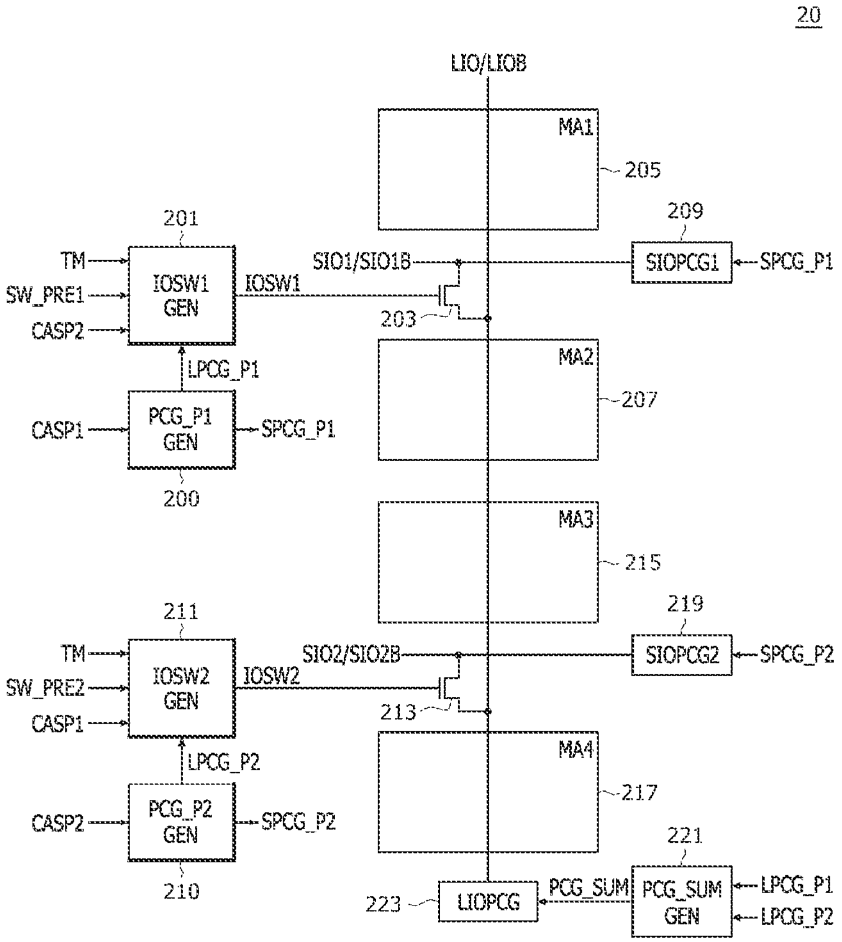
FIG. 4 is a block diagram illustrating a configuration of a semiconductor device according to another embodiment of the present disclosure.

FIG. 4 is a block diagram illustrating a configuration of a semiconductor device 20 according to another embodiment of the present disclosure. As shown in FIG. 4, the semiconductor device 20 may include a first precharge pulse generation circuit (PCG_P1 GEN) 200, a first input/output switching signal generation circuit (IOSW1 GEN) 201, a first input/output switch 203, a first memory cell array (MA1) 205, a second memory cell array (MA2) 207, a first input/output line precharge circuit (SIOPCG1) 209, a second precharge pulse generation circuit (PCG_P2 GEN) 210, a second input/output switching signal generation circuit (IOSW2 GEN) 211, a second input/output switch 213, a third memory cell array (MA3) 215, a fourth memory cell array (MA4) 217, a second input/output line precharge circuit (SIOPCG2) 210, a synthetic precharge pulse generation circuit (PCG_SUM GEN) 221, and a third input/output line precharge circuit (LIOPCG) 223.

The first precharge pulse generation circuit 200 may generate a first precharge pulse SPCG_P1 and a second precharge pulse LPCG_P1, based on a first column pulse CASP1. The first precharge pulse generation circuit 200 may sequentially generate the first precharge pulse SPCG_P1 and the second precharge pulse LPCG_P1 when the first column pulse CASP1 is generated. The first column pulse CASP1 may be generated when a command included in a command address CA is decoded and a column operation including a write operation and a read operation is performed on one of the first memory cell array 205 and the second memory cell array 207, in the semiconductor device 20. The first precharge pulse SPCG_P1 may be generated after the first column pulse CASP1 is generated, and the second precharge pulse LPCG_P1 may be generated after the first precharge pulse SPCG_P1 is generated. However, this is only an example, and the present disclosure is not limited thereto. The first precharge pulse generation circuit 200 may be electrically connected to the first input/output switching signal generation circuit 201, the first input/output line precharge circuit 209, and the synthetic precharge pulse generation circuit 221 to apply the second precharge pulse LPCG_P1 to the first input/output switching signal generation circuit 201, may apply the first precharge pulse SPCG_P1 to the first input/output line precharge circuit 209, and may apply the second precharge pulse LPCG_P1 to the synthetic precharge pulse generation circuit 221.

The first input/output switching signal generation circuit 201 may generate a first input/output switching signal IOSW1 from a first pre-switching signal SW_PRE1, a second column pulse CASP2, and the second precharge pulse LPCG_P1, based on the test mode signal TM. The second column pulse CASP2 may be generated when the command included in the command address CA is decoded and a column operation including a write operation and a read operation is performed on one of the third memory cell array 215 and the fourth memory cell array 217. The first pre-switching signal SW_PRE1 may be activated for a preset interval when the write operation is performed on one of the first memory cell array 205 and the second memory cell array 207, and may be deactivated when the read operation is performed on one of the first memory cell array 205 and the second memory cell array 207. The first input/output switching signal generation circuit 201 may generate the first test column pulse (e.g., TCASP1 in FIG. 5), based on the second column pulse CASP2 and the second precharge pulse LPCG_P1. As an example, the first input/output switching signal generation circuit 201 may generate the first test column pulse (e.g., TCASP1 in FIG. 5) from a time point at which generation of the second precharge pulse LPCG_P1 stops to a time point at which the second column pulse CASP2 is generated. The first input/output switching signal generation circuit 201 may generate the first input/output switching signal IOSW1 from the first pre-switching signal SW_PRE1 and the first test column pulse (e.g., TCASP1 in FIG. 5), based on the test mode signal TM. The test mode signal TM may be activated in the test mode. As an example, the first input/output switching signal generation circuit 201 may output the first test column pulse (e.g., TCASP1 in FIG. 5) as the first input/output switching signal IOSW1 when the test mode signal TM is activated, and may output the first pre-switching signal SW_PRE1 as the first input/output switching signal IOSW1 when the test mode signal TM is deactivated. The first input/output switching signal generation circuit 201 may be electrically connected to the first input/output switch 203 to apply the first input/output switching signal IOSW1 to the first input/output switch 203.

The first input/output switch 203 may be connected between the first input/output line pair SIO1/SIO1B and the second input/output line pair LIO/LIOB to be turned on based on the first input/output switching signal IOSW1. In the test mode, when the read operation is performed on one of the first memory cell array 205 and the second memory cell array 207 and the first precharge pulse SPCG_P1 and the second precharge pulse LPCG_P1 are sequentially generated, the first input/output switch 203 may be turned on by the first input/output switching signal IOSW1 generated based on the second column pulse CASP2 and the second precharge pulse LPCG_P1 to connect the first input/output line pair SIO1/SIO1B and the second input/output line pair LIO/LIOB to each other. When the first input/output line pair SIO1/SIO1B and the second input/output line pair LIO/LIOB are connected to each other in a precharged state, the first input/output line pair SIO1/SIO1B and the second input/output line pair LIO/LIOB may share the precharged voltage level. Accordingly, the precharge time for the first input/output line pair SIO1/SIO1B and the second input/output line pair LIO/LIOB can be reduced. The first input/output switch 203 may be turned off by receiving the first input/output switching signal IOSW1 whose generation is stopped according to the second column pulse CASP2 when a column operation including a write operation and a read operation is performed on one of the third memory cell array 215 and the fourth memory cell array 217. This is to block the first input/output line pair SIO1/SIO1B and the third input/output line pair SIO2/SIO2B from being connected to each other.

The second precharge pulse generation circuit 210 may generate a third precharge pulse SPCG_P2 and a fourth precharge pulse LPCG_P2, based on the second column pulse CASP2. The second precharge pulse generation circuit 210 may sequentially generate the third precharge pulse SPCG_P2 and the fourth precharge pulse LPCG_P2 when the second column pulse CASP2 is generated. The third precharge pulse SPCG_P2 may be generated after the second column pulse CASP2 is generated, and the fourth precharge pulse LPCG_P2 may be generated after the third precharge pulse SPCG_P2 is generated. However, this is only an example, and the present disclosure is not limited thereto. The second precharge pulse generation circuit 210 may be electrically connected to the second input/output switching signal generation circuit 211, the second input/output line precharge circuit 219, and the synthesis precharge pulse generation circuit 221 to apply the fourth precharge pulse LPCG_P2 to the second input/output switching signal generation circuit 211, may apply the third precharge pulse SPCG_P2 to the second input/output line precharge circuit 219, and may apply the fourth precharge pulse LPCG_P2 to the synthesis precharge pulse generation circuit 221.

The second input/output switching signal generation circuit 211 may generate the second input/output switching signal IOSW2 from the second pre-switching signal SW_PRE2, the first column pulse CASP1, and the fourth precharge pulse LPCG_P2, based on the test mode signal TM. The second pre-switching signal SW_PRE2 may be activated for a preset interval when a write operation is performed on one of the third memory cell array 215 and the fourth memory cell array 217, and may be deactivated when a read operation is performed on the third memory cell array 215 and the fourth memory cell array 217. The second input/output switching signal generation circuit 211 may generate a second test column pulse (e.g., TCASP2 in FIG. 6), based on the first column pulse CASP1 and the fourth precharge pulse LPCG_P2. As an example, the second input/output switching signal generation circuit 211 may generate the second test column pulse (e.g., TCASP2 in FIG. 6) from the time point at which generation of the fourth precharge pulse LPCG_P2 stops to the time point at which the first column pulse CASP1 is generated. The second input/output switching signal generation circuit 211 may generate the second input/output switching signal IOSW2 from the second pre-switching signal SW_PRE2 and the second test column pulse (e.g., TCASP2 in FIG. 6), based on the test mode signal TM. As an example, the second input/output switching signal generation circuit 211 may output the second test column pulse (e.g., TCASP2 in FIG. 6) as the second input/output switching signal IOSW2 when the test mode signal TM is activated, and may output the second pre-switching signal SW_PRE2 as the second input/output switching signal IOSW2 when the test mode signal TM is deactivated. The second input/output switching signal generation circuit 211 may be electrically connected to the second input/output switch 213 to apply the second input/output switching signal IOSW2 to the second input/output switch 213.

The second input/output switch 213 may be connected between the third input/output line pair SIO2/SIOB2 and the second input/output line pair LIO/LIOB to be turned on based on the second input/output switching signal IOSW2. In the test mode, when a read operation is performed on one of the third memory cell array 215 and the fourth memory cell array 217 and the third precharge pulse SPCG_P2 and the fourth precharge pulse LPCG_P2 are sequentially generated, the second input/output switch 213 may be turned on by the second input/output switching signal IOSW2 generated based on the first column pulse CASP1 and the fourth precharge pulse LPCG_P2 to connect the third input/output line pair SIO2/SIOB2 and the second input/output line pair LIO/LIOB to each other. When the third input/output line pair SIO2/SIOB2 and the second input/output line pair LIO/LIOB are connected to each other in a precharged state, the third input/output line pair SIO2/SIOB2 and the second input/output line pair LIO/LIOB may share the precharged voltage level. Accordingly, the precharge time for the third input/output line pair SIO2/SIO2B and the second input/output line pair LIO/LIOB can be reduced. The second input/output switch 213 may be turned off according to the second input/output switching signal IOSW2, which stops being generated according to the first column pulse CASP1, when a column operation including a write operation and a read operation is performed on one of the first memory cell array 205 and the second memory cell array 207. This is to block the third input/output line pair SIO2/SIO2B and the second input/output line pair LIO/LIOB from being connected to each other.

The first memory cell array 205 and the second memory cell array 207 may form one bank sharing the first input/output line pair SIO1/SIO1B and the second input/output line pair LIO/LIOB. The third memory cell array 215 and the fourth memory cell array 217 may form another bank sharing the third input/output line pair SIO2/SIO2B and the second input/output line pair LIO/LIOB. Here, two memory cell arrays are shown to form one bank, but this is only an example, and the present disclosure is not limited thereto.

The first input/output line precharge circuit 209 may precharge the first input/output line pair SIO1/SIO1B, based on the first precharge pulse SPCG_P1. The second input/output line precharge circuit 219 may precharge the third input/output line pair SIO2/SIO2B, based on the third precharge pulse SPCG_P2. The synthetic precharge pulse generation circuit 221 may generate the synthetic precharge pulse PCG_SUM, based on the second precharge pulse LPCG_P1 and the fourth precharge pulse LPCG_P2. The synthetic precharge pulse generation circuit 221 may generate a synthetic precharge pulse PCG_SUM when one of the second precharge pulse LPCG_P1 and the fourth precharge pulse LPCG_P2 is generated. The third input/output line precharge circuit 223 may precharge the second input/output line pair LIO/LIOB, based on the synthetic precharge pulse PCG_SUM.

Figure 5:
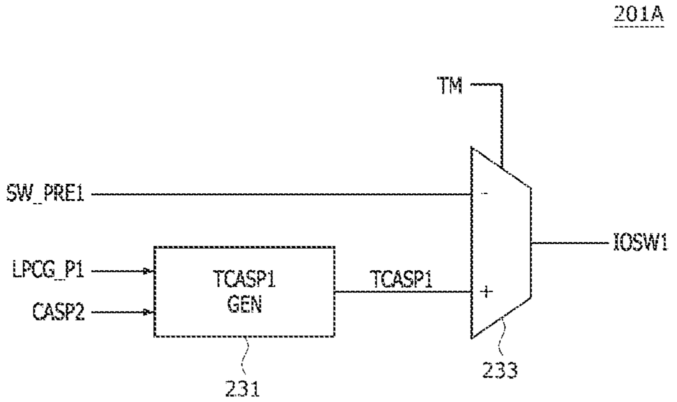
FIG. 5 is a block diagram according to an embodiment of a first input/output switching signal generation circuit included in the semiconductor device shown in FIG. 4.

FIG. 5 is a block diagram of a first input/output switching signal generation circuit 201A according to an embodiment of the first input/output switching signal generation circuit 201 shown in FIG. 4. As shown in FIG. 5, the first input/output switching signal generation circuit 201A may include a first test column pulse generation circuit (TCASP1 GEN) 231 and a first input/output switching signal selection circuit 233.

The first test column pulse generation circuit 231 may generate the first test column pulse TCASP1, based on the second column pulse CASP2 and the second precharge pulse LPCG_P1. As an example, the first test column pulse generation circuit 231 may generate the first test column pulse TCASP1 from the time point at which generation of the second precharge pulse LPCG_P1 stops to the time point at which the second column pulse CASP2 is generated. The first test column pulse generation circuit 231 may be electrically connected to the first input/output switching signal selection circuit 233 to apply the first test column pulse TCASP1 to the first input/output switching signal selection circuit 233.

The first input/output switching signal selection circuit 233 may generate the first input/output switching signal IOSW1 from the first pre-switching signal SW_PRE1 and the first test column pulse TCASP1, based on the test mode signal TM. The first input/output switching signal selection circuit 233 may output the first test column pulse TCASP1 as the first input/output switching signal IOSW1 when the test mode signal TM is activated at a logic "high" level, and may output the first pre-switching signal SW_PRE1 as the first input/output switching signal IOSW1 when the test mode signal TM is deactivated at a logic "low" level.

Figure 6:
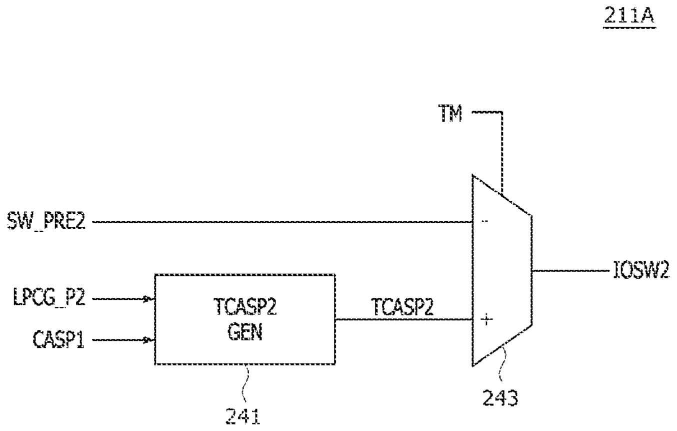
FIG. 6 is a block diagram according to an embodiment of a second input/output switching signal generation circuit included in the semiconductor device shown in FIG. 4.

FIG. 6 is a block diagram of a second input/output switching signal generation circuit 211A according to an embodiment of the second input/output switching signal generation circuit 211 shown in FIG. 4. As shown in FIG. 6, the second input/output switching signal generation circuit 211A may include a second test column pulse generation circuit (TCASP2 GEN) 241 and a second input/output switching signal selection circuit 243.

The second test column pulse generation circuit 241 may generate the second test column pulse TASP2, based on the first column pulse CASP1 and the fourth precharge pulse LPCG_P2. As an example, the second test column pulse generation circuit 241 may generate the second test column pulse TASP2 from the time point at which generation of the fourth precharge pulse LPCG_P2 stops to the time point at which the first column pulse CASP1 is generated. The second test column pulse generation circuit 241 may be electrically connected to the second input/output switching signal selection circuit 243 to apply the second test column pulse TASP2 to the second input/output switching signal selection circuit 243.

The second input/output switching signal selection circuit 243 may generate the second input/output switching signal IOSW2 from the second pre-switching signal SW_PRE2 and the second test column pulse TCASP2, based on the test mode signal TM. The second input/output switching signal selection circuit 243 may output the second test column pulse TCASP2 as the second input/output switching signal IOSW2 when the test mode signal TM is activated at a logic "high" level, and may output the second pre-switching signal SW_PRE2 as the second input/output switching signal IOSW2 when the test mode signal TM is deactivated at a logic "low" level.

Figure 7:
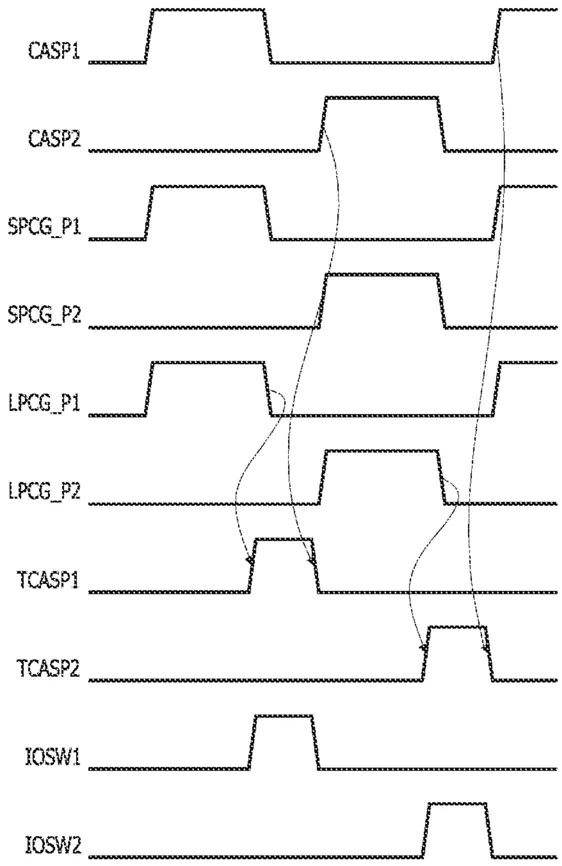
FIG. 7 is a timing diagram illustrating an operation performed for precharging input/output lines during a read operation in a test mode, in the semiconductor device shown in FIGS. 4 to 6.

FIG. 7 is a timing diagram illustrating an operation performed for precharging input/output lines during a read operation in a test mode in the semiconductor device 20 shown in FIGS. 4 to 6.

As shown in FIGS. 4 and 7, when a read operation is performed on one of the first memory cell array 205 and the second memory cell array 207 in the test mode, the first precharge pulse SPCG_P1 and the second precharge pulse LPCG_P1 may be sequentially generated after the first column pulse CASP1 is generated. In addition, when a read operation is performed on one of the third memory cell array 215 and the fourth memory cell array 217 in the test mode, the third precharge pulse SPCG_P2 and the fourth precharge pulse LPCG_P2 may be sequentially generated after the second column pulse CASP2 is generated. The first test column pulse TCASP1 may be generated from the time point at which generation of the second precharge pulse LPCG_P1 stops to the time point at which the second column pulse CASP2 is generated, and the first input/output switch 203 may be turned on by the first input/output switching signal IOSW1 generated by the first test column pulse TCASP1. Accordingly, the first input/output line pair SIO1/SIO1B and the second input/output line pair LIO/LIOB may share the precharged voltage level with each other in the interval in which the first input/output switching signal IOSW1 is generated, thereby reducing the precharge time. The second test column pulse TCASP2 may be generated from the time point at which generation of the fourth precharge pulse LPCG_P2 stops to the time point at which the first column pulse CASP1 is generated, and the second input/output switch 213 may be turned on by the second input/output switching signal IOSW2 generated by the second test column pulse TCASP2. Accordingly, the third input/output line pair SIO2/SIO2B and the second input/output line pair LIO/LIOB may share the precharged voltage level with each other in the interval in which the second input/output switching signal IOSW2 is generated, thereby reducing the precharge time.

Figure 8:
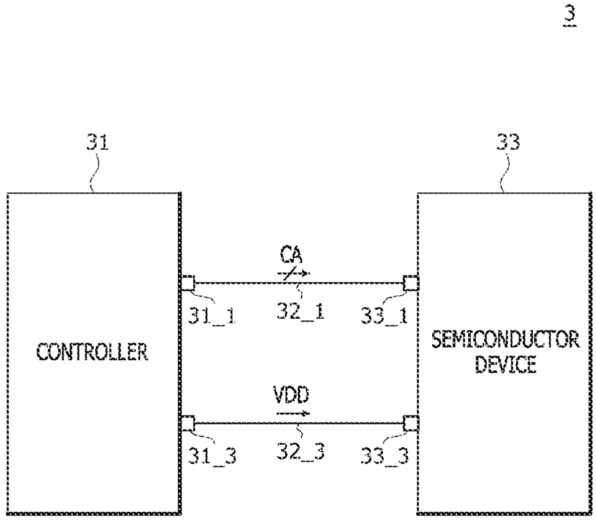
FIG. 8 is a block diagram illustrating a configuration of a semiconductor system according to an embodiment of the present disclosure.

FIG. 8 is a block diagram illustrating a configuration of a semiconductor system 3 according to an embodiment of the present disclosure. As shown in FIG. 8, the semiconductor system 3 may include a controller 31 and a semiconductor device 33.

The controller 31 may include a first control pin 31_1 and a second control pin 31_3. The semiconductor device 33 may include a first device pin 33_1 and a second device pin 33_3. The controller 31 may transmit an external control signal CA to the semiconductor device 33 through a first transmission line 32_1 connected between the first control pin 31_1 and the first device pin 33_1. In the present embodiment, the external control signal CA may include a command and an address, but this is only an example, and the present disclosure is not limited thereto. Each of the first control pin 31_1, the first transmission line 32_1, and the first device pin 33_1 may be implemented in multiple numbers depending on the number of bits of the external control signal CA. The controller 31 may apply a power supply voltage VDD to the semiconductor device 33 through a second transmission line 32_3 connected between the second control pin 31_3 and the second device pin 33_3.

The semiconductor device 33 may connect the first input/output line pair SIO/SIOB and the second input/output line pair LIO/LIOB to each other in a precharged state during a read operation in the test mode, so that the precharge time of the first input/output line pair SIO/SIOB and the second input/output line pair LIO/LIOB can be reduced.

The semiconductor device 10 described with reference to FIG. 1 and the semiconductor device 20 described with reference to FIG. 4 may be applied to electronic systems including memory systems, graphics systems, computing systems, and mobile systems. For example, referring to FIG. 9, which is a block diagram illustrating a configuration of an electronic system 1000 according to an embodiment of the present disclosure, the electronic system 1000 may include a data storage unit 1001, a memory controller 1002, a buffer memory 1003, and an input/output interface 1004.

The data storage unit 1001 may store data (not shown) applied from the memory controller 1002 according to a control signal from the memory controller 1002, and read the stored data (not shown) to output the data to the memory controller 1002. Meanwhile, the data storage unit 1001 may include a non-volatile memory device capable of continuously storing data without loss even when power is cut off. The non-volatile memory device may be implemented with a flash memory (NOR flash memory, NAND flash memory) device, a phase change random-access memory (PRAM) device, a resistive random-access memory (RRAM) device, a spin transfer torque random-access memory (STTRAM) device, or a magnetic random-access memory (MRAM) device.

Figure 9:
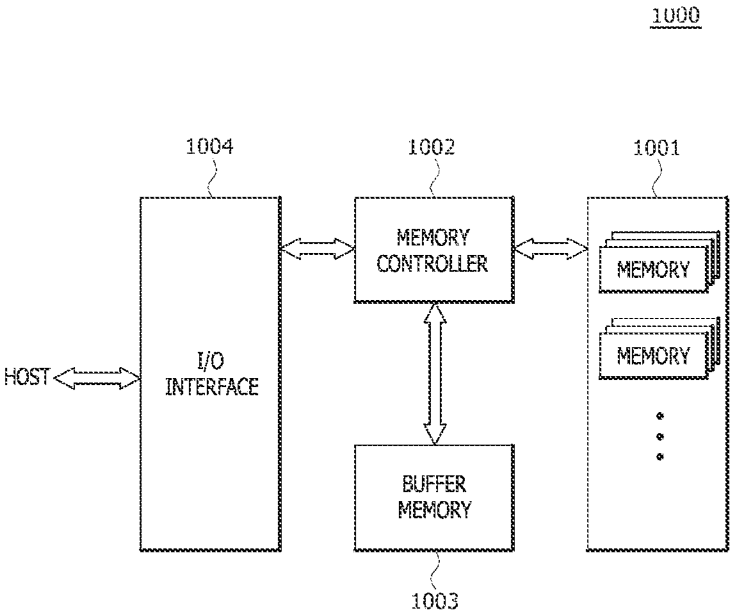
FIG. 9 is a block diagram illustrating a configuration of an electronic system according to an embodiment of the present disclosure.

The memory controller 1002 may decode a command applied from an external device (host device) through the input/output interface 1004, and may control data input/output for the data storage unit 1001 and the buffer memory device 1003 according to a decoding result. In FIG. 9, the memory controller 1002 is shown as one block, but a controller for controlling the data storage unit 1001 and a controller for controlling the buffer memory device 1003, which is a volatile memory device, may be configured independently.

The buffer memory device 1003 may temporarily store data to be processed by the memory controller 1002, that is, data (not shown) input and output to and from the data storage unit 1001. The buffer memory device 1003 may store data (not shown) applied from the memory controller 1002 according to a control signal. The buffer memory device 1003 may include the semiconductor device 10 described above with reference to FIG. 1 and the semiconductor device 20 described above with reference to FIG. 4. The buffer memory device 1003 may read out the stored data and output the data to the memory controller 1002. The buffer memory device 1003 may include volatile memory devices such as a dynamic random-access memory (DRAM) device, a mobile DRAM device, and a static random-access memory (SRAM) device.

The input/output interface 1004 may provide a physical connection between the memory controller 1002 and an external device (host) to allow the memory controller 1002 to receive a control signal for data input/output from the external device and to exchange data with the external device. The input/output interface 1004 may include one of a variety of interface protocols such as USB, MMC, PCI-E, SAS, SATA, PATA, SCSI, ESDI, IDE, and the like.

The electronic system 1000 may be used as an auxiliary storage device of a host device or an external storage device. The electronic system 1000 may include a solid state disk (SSD), a universal serial bus (USB) memory device, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multimedia card (eMMC), a compact flash (CF), and the like.

Figure 10:
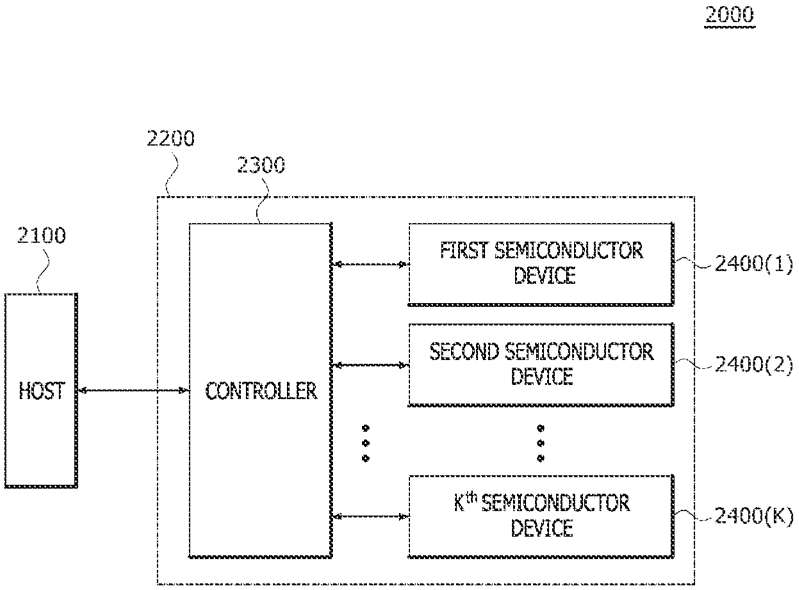
FIG. 10 is a block diagram illustrating a configuration of an electronic system according to another embodiment of the present disclosure.

FIG. 10 is a block diagram illustrating a configuration of an electronic system 2000 according to another embodiment of the present disclosure. As shown in FIG. 10, the electronic system 2000 may include a host 2100 and a semiconductor system 2200.

The host 2100 and the semiconductor system 2200 may transmit signals to each other using interface protocols. The interface protocols used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1: K). Each of the semiconductor devices 2400(1: K) may include the semiconductor device 10 described with reference to FIG. 1 and the semiconductor device 20 described with reference to FIG. 4. Each of the semiconductor devices 2400(1:K) may connect the first input/output line pair SIO/SIOB and the second input/output line pair LIO/LIOB to each other in a precharged state during a read operation in a test mode. Accordingly, the precharge time for the first input/output line pair SIO/SIOB and the second input/output line pair LIO/LIOB can be reduced. Each of the semiconductor devices 2400(1:K) may be implemented with dynamic random-access memory (DRAM), phase change random-access memory (PRAM), resistive random-access memory (RRAM), magnetic random-access memory (MRAM), or ferroelectric random-access memory (FRAM).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:

a precharge pulse generation circuit configured to generate a first precharge pulse and a second precharge pulse based on a column pulse generated when a column operation including a write operation and a read operation is performed; and an input/output switching signal generation circuit configured to generate an input/output switching signal that directly connects a first input/output line pair to a second input/output line pair based on the first precharge pulse and the second precharge pulse during a test mode.

2. The semiconductor device of claim 1, wherein the precharge pulse generation circuit is configured to sequentially generate the first precharge pulse and the second precharge pulse after the column pulse is generated.

3. The semiconductor device of claim 1, wherein the precharge pulse generation circuit is configured to:

generate the first precharge pulse after the column pulse is generated; and generate the second precharge pulse after the first precharge pulse is generated.

4. The semiconductor device of claim 1, wherein the input/output switching signal generation circuit is configured to generate the input/output switching signal from a pre-switching signal, the first precharge pulse, and the second precharge pulse, based on a test mode signal.

5. The semiconductor device of claim 4, wherein the input/output switching signal generation circuit is configured to receive the test mode signal that is activated in the test mode.

6. The semiconductor device of claim 4, wherein the input/output switching signal generation circuit is configured to:

generate the pre-switching signal that is activated during a preset interval when the write operation is performed; and generate the pre-switching signal that is deactivated when the read operation is performed.

7. The semiconductor device of claim 4, wherein the input/output switching signal generation circuit is configured to generate a test column pulse, based on the first precharge pulse and the second precharge pulse in the test mode.

8. The semiconductor device of claim 7, wherein the input/output switching signal generation circuit is configured to generate the test column pulse from a time point at which the second precharge pulse is generated to a time point at which the first precharge pulse is generated in the test mode.

9. The semiconductor device of claim 7, wherein the input/output switching signal generation circuit is configured to output the test column pulse as the input/output switching signal in the test mode.

10. The semiconductor device of claim 4, wherein the input/output switching signal generation circuit is configured to output the pre-switching signal as the input/output switching signal when the test mode is not performed.

11. The semiconductor device of claim 1, further comprising a bank connected to the first input/output line pair and the second input/output line pair.

12. The semiconductor device of claim 1, further comprising an input/output switch connected between the first input/output line pair and the second input/output line pair, the input/output switch configured to be turned on based on the input/output switching signal.

13. The semiconductor device of claim 1, further comprising:

a first input/output line precharge circuit configured to precharge the first input/output line pair, based on the first precharge pulse; and a second input/output line precharge circuit configured to precharge the second input/output line pair, based on the second precharge pulse.

14. A semiconductor device comprising:

a first precharge pulse generation circuit configured to generate a first precharge pulse and a second precharge pulse based on a first column pulse generated when a first column operation including a write operation and a read operation is performed on a first bank;

a second precharge pulse generation circuit configured to generate a third precharge pulse and a fourth precharge pulse based on a second column pulse generated when a second column operation including a write operation and a read operation is performed on a second bank; and an input/output switching signal generation circuit configured to generate a first input/output switching signal that directly connects a first input/output line pair and a second input/output line pair based on the second column pulse and the second precharge pulse during a test mode.

15. The semiconductor device of claim 14, wherein the first precharge pulse generation circuit is configured to sequentially generate the first precharge pulse and the second precharge pulse after the first column pulse is generated.

16. The semiconductor device of claim 14, wherein the second precharge pulse generation circuit is configured to sequentially generate the third precharge pulse and the fourth precharge pulse after the second column pulse is generated.

17. The semiconductor device of claim 14, wherein the first input/output switching signal generation circuit is configured to generate the first input/output switching signal from a first pre-switching signal, the second column pulse, and the second precharge pulse, based on a test mode signal.

18. The semiconductor device of claim 17, wherein the first input/output switching signal generation circuit is configured to:

generate the first pre-switching signal that is activated during a preset interval when a write operation on the first bank is performed; and generate the first pre-switching signal that is deactivated when a read operation on the first bank is performed.

19. The semiconductor device of claim 17, wherein the first input/output switching signal generation circuit is configured to generate a first test column pulse, based on the second column pulse and the second precharge pulse in the test mode.

20. The semiconductor device of claim 19, wherein the first input/output switching signal generation circuit is configured to generate the first test column pulse from a time point at which the second precharge pulse is generated to a time point at which the second column pulse is generated in the test mode.

21. The semiconductor device of claim 19, wherein the first input/output switching signal generation circuit is configured to output the first test column pulse as the first input/output switching signal in the test mode.

22. The semiconductor device of claim 17, wherein the first input/output switching signal generation circuit is configured to output the first pre-switching signal as the first input/output switching signal when the test mode is not performed.

23. The semiconductor device of claim 14, wherein the first bank is connected to the first input/output line pair and the second input/output line pair.

24. The semiconductor device of claim 14, further comprising a first input/output switch connected between the first input/output line pair and the second input/output line pair, the first input/output switch configured to be turned on based on the first input/output switching signal.

25. The semiconductor device of claim 14, further comprising a second input/output switching signal generation circuit configured to generate a second input/output switching signal for connecting a third input/output line pair and the second input/output line pair to each other, based on the first column pulse and the fourth precharge pulse in the test mode.

26. The semiconductor device of claim 25, wherein the second input/output switching signal generation circuit is configured to generate the second input/output switching signal from a second pre-switching signal, the first column pulse, and the fourth precharge pulse, based on a test mode signal.

27. The semiconductor device of claim 26, wherein the second input/output switching signal generation circuit is configured to:

generate the second pre-switching signal that is activated during a preset interval when a write operation on the second bank is performed; and generate the second pre-switching signal that is deactivated when a read operation on the second bank is performed.

28. The semiconductor device of claim 26, wherein the second input/output switching signal generation circuit is configured to generate a second test column pulse, based on the first column pulse and the fourth precharge pulse in the test mode.

29. The semiconductor device of claim 28, wherein the second input/output switching signal generation circuit is configured to generate the second test column pulse from a time point at which the fourth precharge pulse is generate to a time point at which the first column pulse is generated in the test mode.

30. The semiconductor device of claim 28, wherein the second input/output switching signal generation circuit is configured to output the second test column pulse as the second input/output switching signal in the test mode.

31. The semiconductor device of claim 27, wherein the second input/output switching signal generation circuit is configured to output the second pre-switching signal as the second input/output switching signal when the test mode is not performed.

32. The semiconductor device of claim 25, wherein the second bank is connected to the third input/output line pair and the second input/output line pair.

33. The semiconductor device of claim 25, further comprising a second input/output switch connected between the third input/output line pair and the second input/output line pair, the second input/output switch configured to be turned on based on the second input/output switching signal.

34. The semiconductor device of claim 25, further comprising:

a first input/output line precharge circuit configured to precharge the first input/output line pair, based on the first precharge pulse;

a second input/output line precharge circuit configured to precharge the third input/output line pair, based on the third precharge pulse;

a synthetic precharge pulse generating circuit configured to generate a synthetic precharge pulse, based on the second precharge pulse and the fourth precharge pulse; and a third input/output line precharge circuit configured to precharge the second input/output line pair, based on the synthetic precharge pulse.

* * * * *